US 6,561,267 B2

(12) United States Patent
Sauciuc et al.

(10) Patent No.: US 6,561,267 B2
(45) Date of Patent: May 13, 2003

(54) HEAT SINK AND ELECTRONIC CIRCUIT MODULE INCLUDING THE SAME

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,329

(22) Filed: Sep. 28, 2001

(65) Prior Publication Data

US 2003/0062151 A1 Apr. 3, 2003

(51) Int. Cl.[7] .................................................. F28F 7/00
(52) U.S. Cl. .................... 165/185; 165/80.3; 174/16.3; 361/695; 361/704; 257/722
(58) Field of Search ........................... 165/80.3, 185, 165/907; 174/16.3; 257/722; 361/702, 704, 707, 695

(56) References Cited

U.S. PATENT DOCUMENTS

| | | | | | |
|---|---|---|---|---|---|
| 2,112,743 A | * | 3/1938 | Poole | .......................... | 165/907 |
| 4,037,751 A | * | 7/1977 | Miller et al. | ................. | 165/185 |
| 4,843,693 A | * | 7/1989 | Chisholm | .................... | 165/185 |
| 5,180,001 A | * | 1/1993 | Okada et al. | .............. | 165/80.4 |
| 5,195,576 A | * | 3/1993 | Hatada et al. | .............. | 165/80.3 |
| 5,312,508 A | * | 5/1994 | Chisholm | .................... | 156/292 |
| 5,358,032 A | * | 10/1994 | Arai et al. | .................. | 165/80.3 |
| 6,018,459 A | * | 1/2000 | Carlson et al. | ............. | 361/704 |
| 6,269,864 B1 | | 8/2001 | Kabadi | | |

* cited by examiner

Primary Examiner—Henry Bennett
Assistant Examiner—Terrell McKinnon
(74) Attorney, Agent, or Firm—Antonelli, Terry, Stout & Kraus, LLP

(57) ABSTRACT

A heat sink, is made to have a decreased thermal resistance (sink to ambient heat dissipation) and increased heat transfer coefficient by reducing the thickness of the thermal boundary layer. The heat sink includes a thermally conductive base and a plurality of fins extending from a surface of the thermally conductive base. The fins are made of a thermally conductive mesh material. Alternatively, the heat sink can include a thermally conductive base and a plurality of pins extending perpendicularly from a surface of the thermally conductive base, the plurality of pins being made of a thermally conductive material, and being arranged in a plurality of rows, and a plurality of wires extending parallel to the thermally conductive base, each of the wires connecting the pins of one of the plurality of rows.

9 Claims, 8 Drawing Sheets

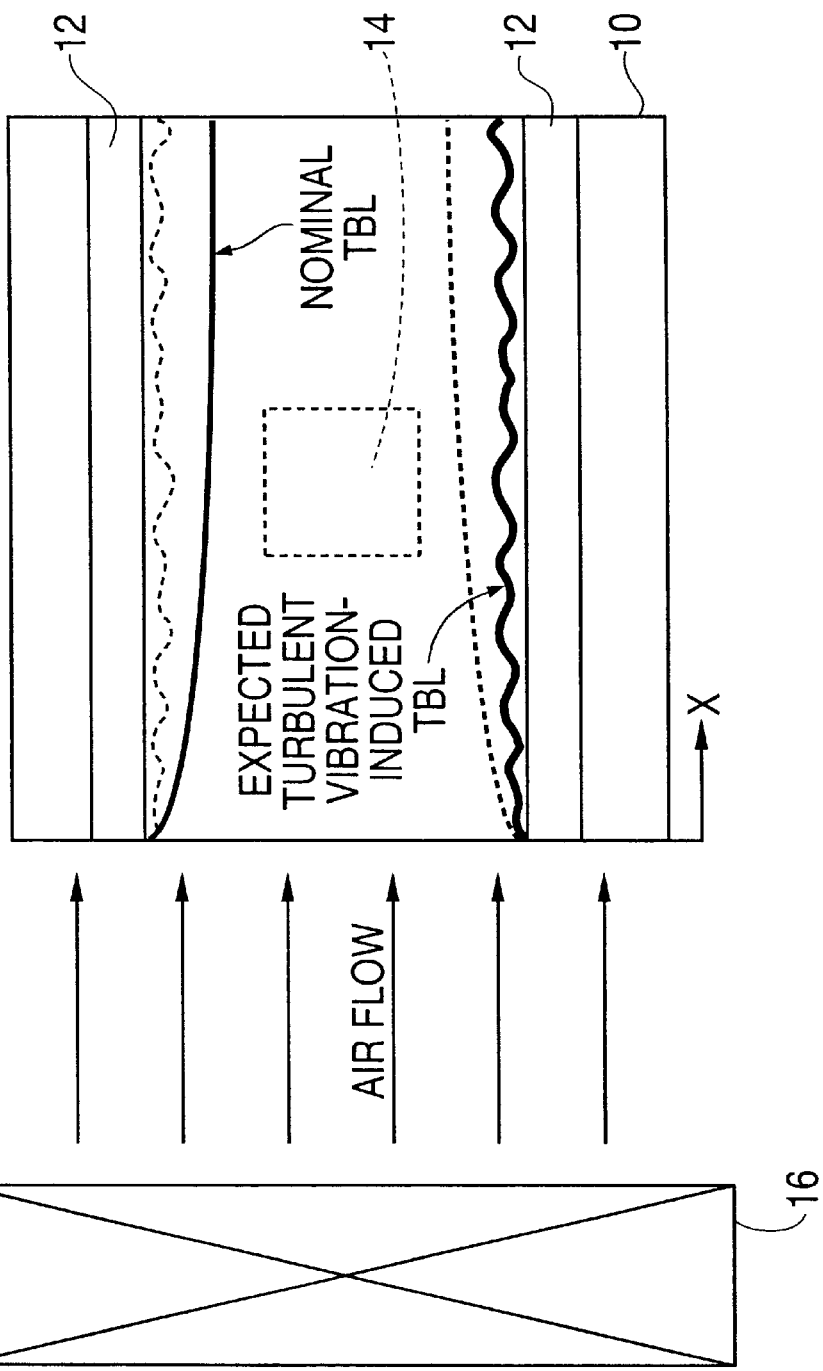

HEAT SINK AND ELECTRONIC CIRCUIT MODULE INCLUDING THE SAME

FIELD

The present invention is directed to a heat sink and an electronic circuit module including the same. More particularly, the present invention is directed to a heat sink having wire mesh fins or a plurality of pins and horizontal wires for heat dissipation.

BACKGROUND

Microprocessors and other electronic circuit components are becoming more and more powerful with increasing capabilities, resulting in increasing amounts of heat generated from these components. Packaged units and integrated circuit die sizes of these components are decreasing or remaining the same, which increases the amount of heat energy given off by the components for a given unit of surface area. Furthermore, as computer related equipment becomes more powerful, more and more components are being placed inside the equipment, which is also decreasing in size, resulting in additional heat generation in a smaller volume of space. Increased temperatures can potentially damage the components of the equipment, or reduce the lifetime of the individual components and the equipment. Therefore, large amounts of heat produced by many such integrated circuits must be dissipated, and therefore must be accounted for in designing the integrated circuit mounting and packaging devices.

Electronic components can be attached to a heat sink in order to dissipate heat from the components. One type of heat sink that may be used is a parallel plate heat sink, such as that shown in FIGS. 1A and 1B. As shown in FIGS. 1A and 1B, such a heat sink includes a thermally conductive base 10 and fins 12. The fins 12 have generally planar, parallel major surfaces and are arranged generally parallel to one another. Cooling air, blown by a cooling fan, not shown, can flow in gaps or spaces between the plates either in a direction parallel to the base 10 or perpendicular thereto.

Another type of heat sink is shown in FIGS. 2A–2C. The heat sink shown in FIGS. 2A–2C is similar to that shown in FIGS. 1A and 1B, and includes a thermally conductive base 10 and fins 12'. The fins 12' in the heat sink shown in FIGS. 2A–2C are made of, e.g., a single piece of thermally conductive material folded to provide a plurality of parallel fins 12'.

The overall size of the heat sinks is limited by the volume constraints of the housing. To improve the amount of heat dissipated from the heat producing components, there is a need to increase the surface area of the heat sinks without increasing the volume of the heat sinks. One technique to increase surface area is to reduce the spacing between fins of the heat sink to increase the surface area of the heat sink. However, this results in tighter spacing between fins, which in turn increases air flow resistance resulting in higher thermal resistance.

U.S. Pat. No. 6,269,864 accomplishes an increased surface area by, in one embodiment, having a thermally conductive base including a plurality of fin structures extending upwardly from the thermally conductive base, the plurality of fin structures having a plurality of surface area enhancer structures extending outwardly from a first surface of the plurality of fin structures to increase a convection surface area of the heat sink for a given volume.

In parallel plate type heat sinks, as cooling fluid, e.g., air, is blown between the plates, a laminar or turbulent boundary layer forms along the surface of the plate. Lacking an efficient heat transfer mechanism, the speed and power capabilities of the electronic circuit modules are severely limited. The parallel plates or folded fins type systems allow the development of thick boundary layers, and thus higher thermal resistance. Although narrow channel heat sinks significantly improve heat dissipation, they, like other plate fin designs, suffer from boundary layer formation. The boundary layer consists of hydrodynamic and thermal layers, which result from friction or drag between cooling fluid and a plate fin. The layer tends to blanket the plate fin thereby insulating it from the cooler fluid flow. Thus reduces heat transfer. Additionally, the layer narrows the remaining channel available to fluid flow, which further impedes fluid flow thereby compounding the problem. The boundary layer therefore thickens as the fluid progresses down the channel contributing to high pressure within the fin field.

To reduce boundary layer formation in heat exchangers, it is possible include irregularities such as protrusions, indentations and louvers along the plate fin surface. These irregularities are intended to disturb the boundary layer to prevent it from building up. From the standpoint of boundary layer disruption, the greatest improvement would be a device having as many irregularities as possible. Unfortunately, however, such an approach leads to practical problems. Extrusion techniques are limited to producing lengthwise ridges (horizontal and vertical), which have limited ability to disrupt the boundary layer. Other manufacturing techniques such as casting and machining also preclude intricate plate fin textures. Perhaps more importantly though, increasing irregularities, as described above, also decreases the velocity of the passing fluid within the channels formed by the textured plate fins which tends to increase the pressure drop through the fin field.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein:

FIG. 3 is a top plan view schematically illustrating the formation of a thermal boundary layer in a parallel plate type heat sink;

DETAILED DESCRIPTION

Figure 1A:
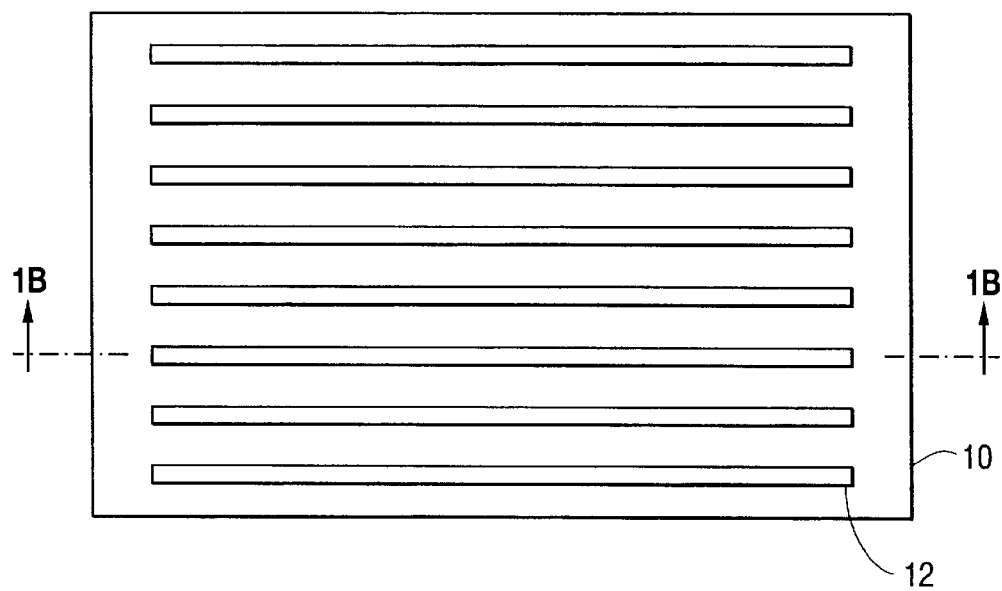
FIGS. 1A and 1B are top plan and cross-sectional views, respectively, of an example of a parallel plate type heat sink useful in gaining a more thorough understanding/appreciation of the present invention.
Figure 1B:
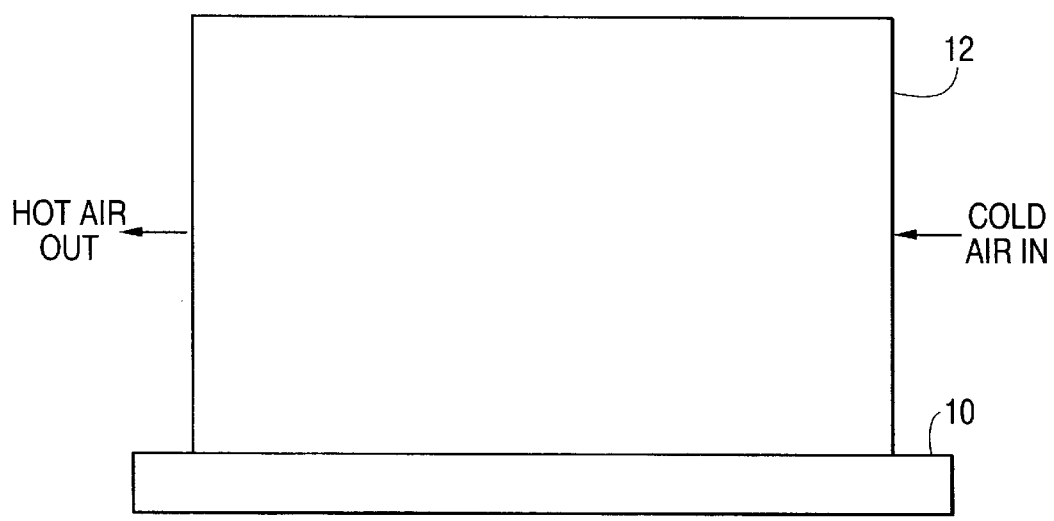
Figure 2A:
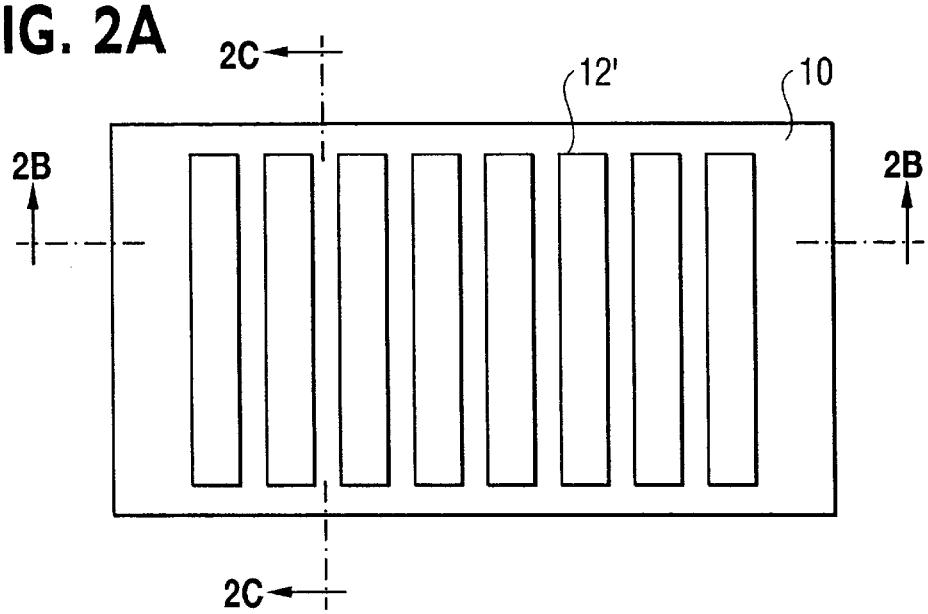
FIGS. 2A–2C are top plan and cross-sectional views of an example of a parallel plate type heat sink with folded type fins useful in gaining a more thorough understanding/appreciation of the present invention.
Figure 2B:
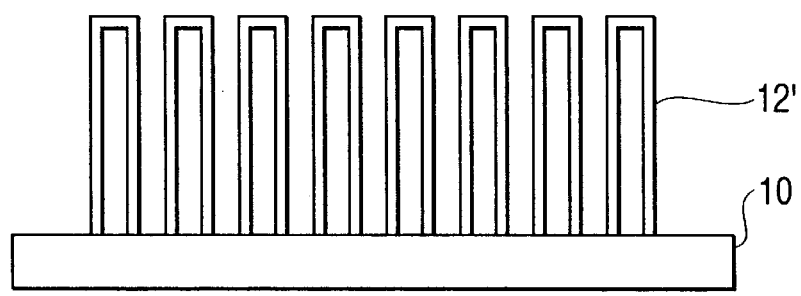
Figure 2C:
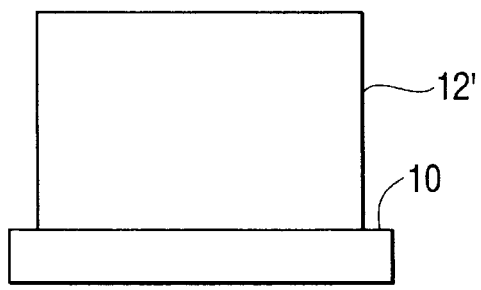

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Example arbitrary axes (e.g., X-axis, Y-axis and/or Z-axis) may be discussed/illustrated, although practice of embodiments of the present invention is not limited thereto (e.g., differing axes directions may be able to be assigned). Still further, the figures are not drawn to scale. Further, arrangements may be shown in block or schematic diagram form in order to avoid obscuring the invention, and also in view of the fact that specifics with respect to implementation of such block or schematic diagram arrangements are highly dependent upon the platform within which the present invention is to be implemented, i.e., such specifics should be well within purview of one skilled in the art. Where specific details are set forth in order to describe example embodiments of the invention, it should be apparent to one skilled in the art that the invention can be practiced without, or with variation of, these specific details.

Figure 4A:
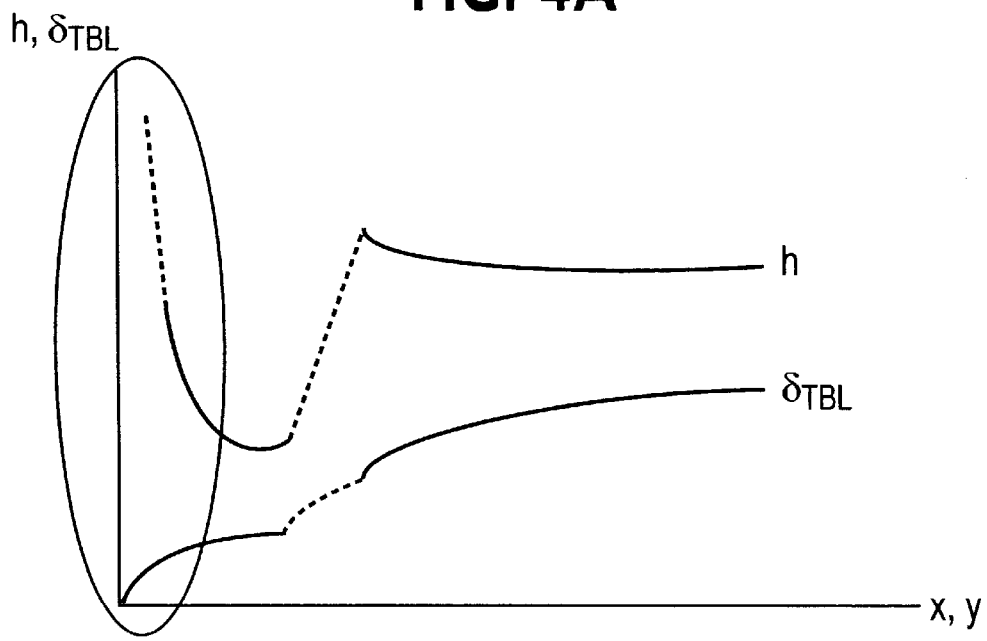
FIGS. 4A and 4B are graphs illustrating the problems associated with formation of a thermal boundary layer in a parallel plate type heat sink.
Figure 4B:
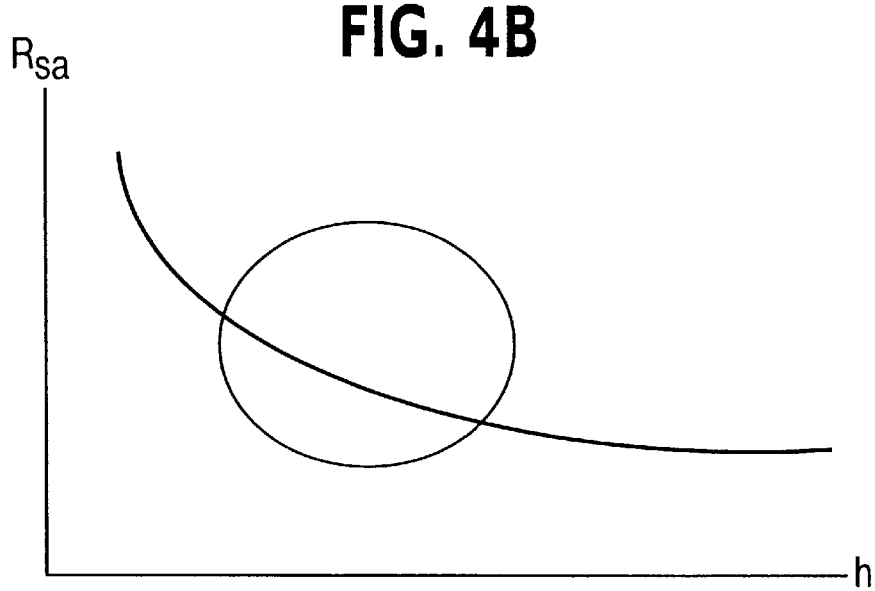

FIGS. 3, 4A and 4B illustrate the formation of a thermal boundary layer in a parallel plate type heat sink and the problems caused thereby. FIG. 3 shows a parallel plate type heat sink including a thermally conductive base 10 and a pair of adjacent parallel plate fins 12. Only two fins 12 are illustrated for simplicity, but, of course, many more such fins are provided. An electronic circuit module 14 is thermally coupled to the side of the base 10 opposite the fins 12. A fan 16 is provided for blowing cooling fluid, e.g., air, through the spaces between fins 12. As can be seen in FIG. 3, a thermal boundary layer TBL is produced along the surface of each fin 12 that increases or thickens along the x direction. The thermal boundary layer TBL consists of hydrodynamic and thermal layers, which result from friction or drag between cooling fluid and a plate fins 12. The layer tends to blanket the plate fin 12 thereby insulating it from the cooler fluid flow. Thus reduces heat transfer. Additionally, the layer narrows the remaining channel available to fluid flow, which further impedes fluid flow thereby compounding the problem. The boundary layer therefore thickens as the fluid progresses down the channel contributing to high pressure within the fin field.

FIG. 4A shows the heat transfer coefficient h of the fins 12 and the thickness $\delta_{TBL}$ of the thermal boundary layer TBL as a function of the length of the channel between fins 12 in the x direction. As can be seen from FIG. 4A, the heat transfer coefficient h of the fins 12 decreases as the thickness $\delta_{TBL}$ of the thermal boundary layer TBL increases along the length of the channel between fins 12 in the x direction.

As shown in FIG. 4B, the thermal resistance $R_{sa}$ of the heat sink (sink to ambient heat dissipation) decreases as the heat transfer coefficient increases. The circled area in the graph in FIG. 4A corresponds to the circled area in the graph in FIG. 4B. Thus, in order to advantageously decrease the thermal resistance $R_{sa}$ of the heat sink, it is necessary to increase the heat transfer coefficient h by reducing the thickness of the thermal boundary layer TBL.

Figure 5A:
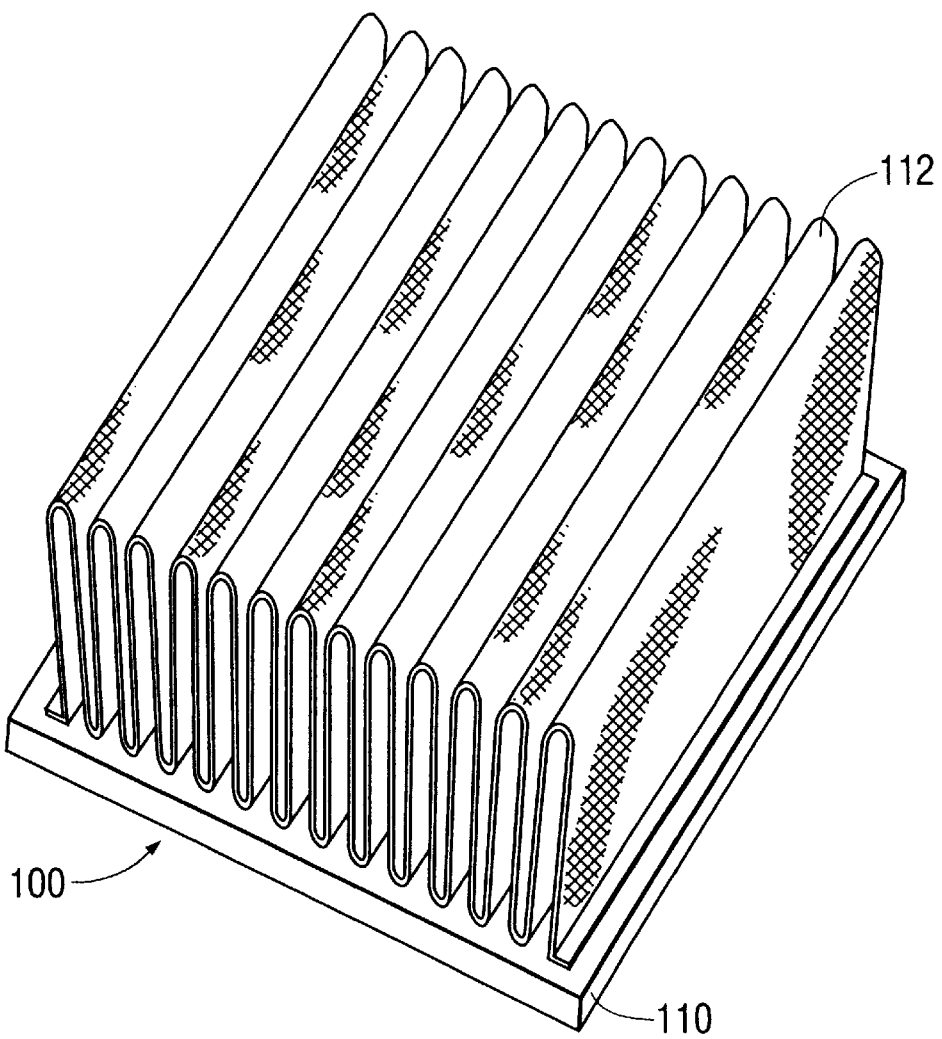
FIGS. 5A–5C are perspective, plan and cross-sectional views, respectively of a heat sink according to one embodiment of the present invention.
Figure 5B:
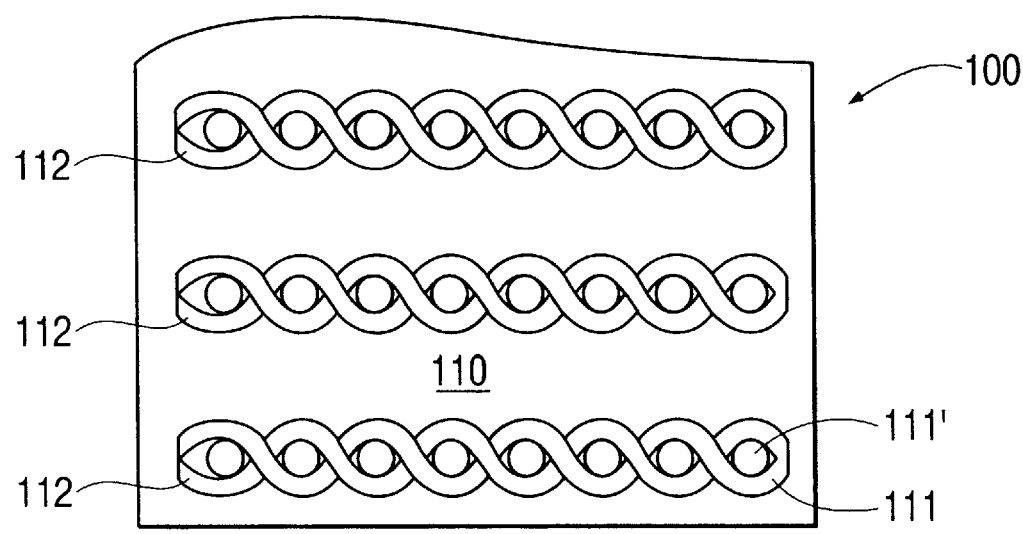
Figure 5C:
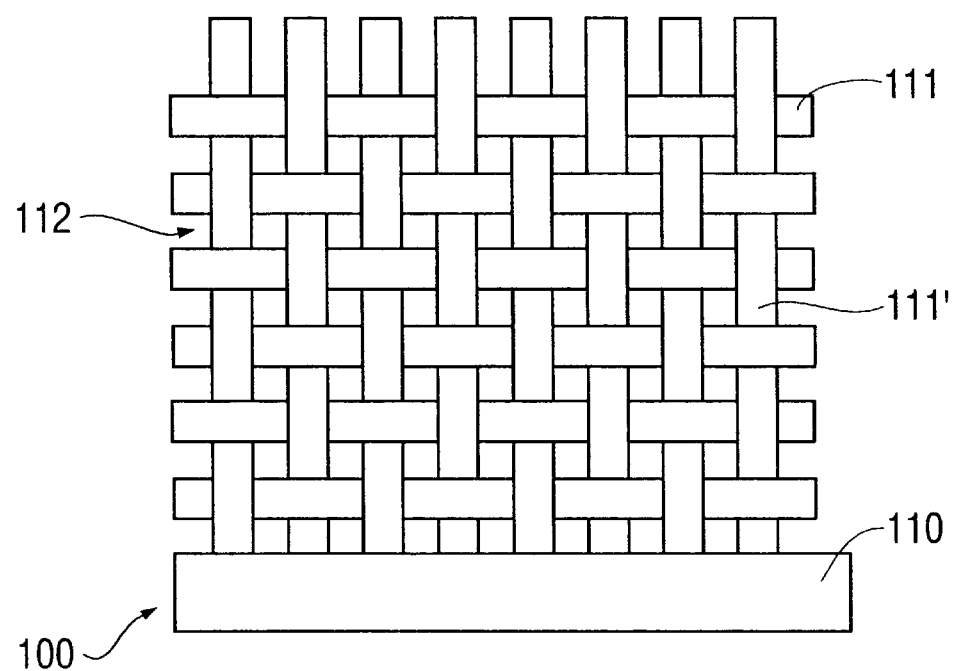

FIGS. 5A–5C show one embodiment of the present invention that advantageously decreases the thermal resistance $R_{sa}$ of the heat sink and increases the heat transfer coefficient h by reducing the thickness of the thermal boundary layer TBL. FIG. 5A is a perspective view of the heat sink 100 of one embodiment of the present invention and FIG. 5B is a simplified schematic plan view thereof. FIG. 5C is a simplified schematic cross-sectional view along lines 5C—5C of FIG. 5B.

As shown in FIGS. 5A–5C, the heat sink 100 includes a thermally conductive base 110 having first and second opposed major surfaces and a plurality of fins 112 extending from the base 110. Both the base 110 and the fins 112 can be made of materials known in the art to be thermally conductive. For example the base 110 and the fins 112 can be made of an oxygen free, high thermal conductivity copper alloy. The fins 112 can also be made of aluminum. The fins 112 have parallel, opposed, generally planar major surfaces.

The fins 112 are made of a mesh material, more particularly in this embodiment of a woven wire mesh material as can best be seen in FIGS. 5B and 5C. The woven mesh comprises a plurality of intertwined wires, e.g., horizontal wires 111 interlocked with vertical wires 111'. It is advantageous to braze, solder or weld the horizontal wires 111 to the vertical wires 111'. The preferred mesh size will vary with the application. As an example only, the mesh size may be up to 150 wires per inch, preferably 50–150 wires per inch. The horizontal mesh size may differ from the vertical mesh size depending on the application. As an example only, the wires may be 0.3–1.0 mm in diameter. The surfaces of the mesh, while overall can be considered generally planar, have surface irregularities that disrupt the formation of boundary layers along the fins 112.

The mesh fins 112 are attached to and thermally coupled with the base 110 by any means known in the art. For example, the mesh fins 112 can be attached to and thermally coupled with the base 110 by brazing, soldering or welding. The attachment is not specifically shown in FIGS. 5A–5C for the sake of simplicity.

The use of the mesh fins 112 deters high-pressure formation, prevents the premature egress of fluid from the fin field caused by high pressure, and/or minimizes boundary layer formation with only a small increase in pressure drop. The woven mesh provides a nearly continuous level of surface irregularities caused by the intertwined mesh.

Another advantage of the mesh fins 112 is the inherent porosity of this heat transfer surface. Manufacturing variations in fin spacing can cause mal-distribution of the airflow through each fin channel. This would result in some channels receiving less air than others. However, with the porous fin design of the mesh fins 112, those channels with greater pressure development will transfer air through the fin 112 to the neighboring lower pressure channels thus redistributing the airflow more uniformly. Mal-distribution of the approach flow is redistributed the same way, resulting in a heat sink 100 that is less sensitive to the inlet flow conditions.

Each fin 112 can be made of an individual mesh piece. However, one convenient way of manufacturing the fins 112 is to make the fins 112 as folded-type fins 112. That is, all or at least a plurality of the fins 112 can be formed from a single mesh sheet that is folded, e.g., accordion style, to provide a plurality of parallel or generally parallel fins 112. The folds provide a convenient surface area to attach to the base 110, e.g., by brazing, soldering or welding.

It is also possible to vary the mesh size, wire density or material used among the fins 112. For example, the fins toward the interior can be made to have a higher wire density than the fins toward the edges. Likewise, it is also possible to vary the mesh size, wire density or material used within each fin 112.

Figure 6:
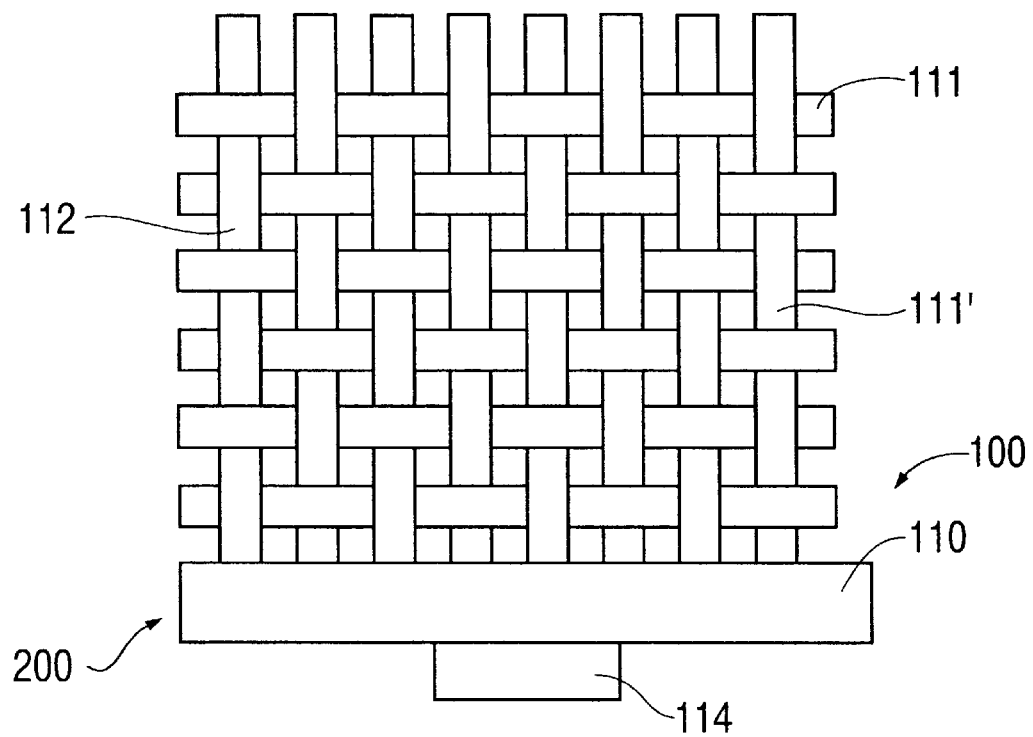
FIG. 6 is a schematic side view of an electronic circuit module including the heat sink of the embodiment shown in FIGS. 5A–5C.

FIG. 6 is a schematic side view of an electronic circuit module 200 including the heat sink 100 of the embodiment shown in FIGS. 5A–5C. As shown in FIG. 6, the electronic circuit module 200 includes the heat sink 100 of the embodiment shown in FIGS. 5A–5C and an electronic circuit component 114 thermally coupled, in a manner known in the art, to a surface of the thermally conductive base 110 opposite the surface to which the fins 112 are attached.

Figure 7:
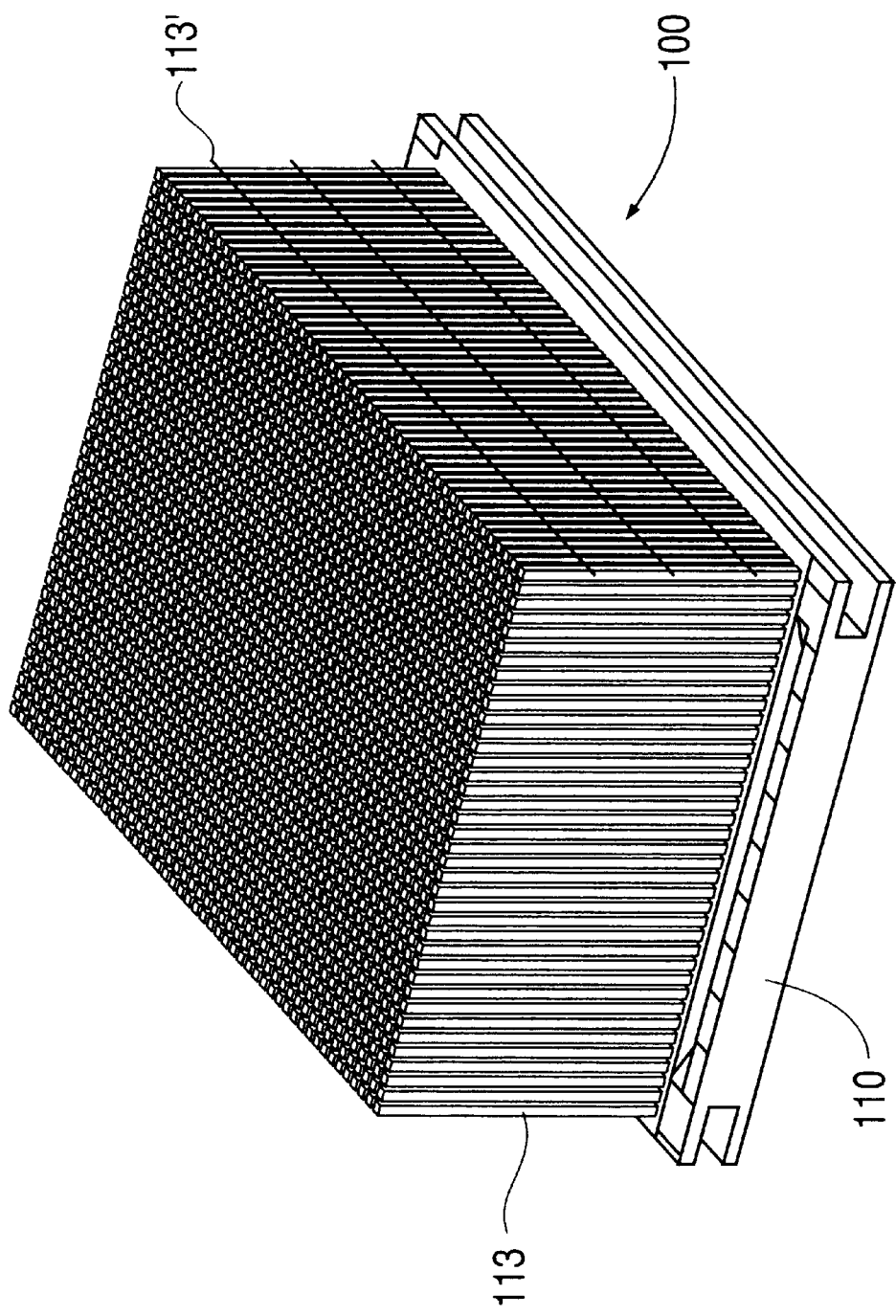
FIG. 7 is perspective view of a heat sink according to another embodiment of the present invention.

FIG. 7 is perspective view of a heat sink 100 according to another embodiment of the present invention. The heat sink 100 of the embodiment shown in FIG.7 has a thermally conductive base 110 having first and second opposed major surfaces and a plurality of pins 113 extending perpendicularly from a surface of the thermally conductive base 110. The pins are made of a thermally conductive material, and are arranged in a plurality of rows. A plurality of wires 113' extends parallel to the thermally conductive base 110, each of the wires connecting the pins 113 of one of the plurality of rows. Each row of pins 113 and wires 113' can be made of a woven mesh material having a reduced number of horizontal wires. Both the base 110 and the pins 113 can be made of materials known in the art to be thermally conductive. For example the base 110 and the pins 113 can be made of an oxygen free, high thermal conductivity copper alloy. The pins 113 can also be made of aluminum.

The heat sink 100 of this embodiment can be used to provide an electronic circuit module by attaching an electronic circuit component in a thermally coupled manner, as would be known in the art, to a surface of the thermally conductive base 110 opposite the surface to which the pins 113 are attached.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art. For example, while the heat sink of the present invention has been described to be useful in connection with dissipating heat from an electronic circuit module, the heat sink may be used to dissipate heat from any other heat-producing component.

What is claimed is:

1. An electronic circuit module, comprising:

a thermally conductive base having first and second opposed major surfaces;

an electronic circuit component thermally coupled to the first major surface of the thermally conductive base;

a plurality of pins extending perpendicularly from the second major surface of the thermally conductive base, the plurality of pins being made of a thermally conductive material, and being arranged in a plurality of rows; and a plurality of wires extending parallel to the thermally conductive base, each of the wires connecting the pins of one of the plurality of rows.

2. An electronic circuit module as claimed in claim 1, wherein:

each of the plurality of wires extending parallel to the thermally conductive base is woven around the pins of one of the plurality of rows.

3. An electronic circuit module as claimed in claim 2, wherein:

each row of pins includes more pins than wires extending parallel to the thermally conductive base.

4. An electronic circuit module as claimed in claim 1, wherein:

the plurality of rows are arranged in parallel to one another with a gap between adjacent rows.

5. An electronic circuit module as claimed in claim 1, further comprising:

a fan for blowing cooling air between the plurality of pins.

6. A heat sink, comprising:

a thermally conductive base;

a plurality of pins extending perpendicularly from a surface of the thermally conductive base, the plurality of pins being made of a thermally conductive material, and being arranged in a plurality of rows; and a plurality of wires extending parallel to the thermally conductive base, each of the wires connecting the pins of one of the plurality of rows.

7. A heat sink as claimed in claim 6, wherein:

each of the plurality of wires extending parallel to the thermally conductive base is woven around the pins of one of the plurality of rows.

8. A heat sink as claimed in claim 7, wherein:

each row of pins includes more pins than wires extending parallel to the thermally conductive base.

9. A heat sink as claimed in claim 6, wherein:

the plurality of rows are arranged in parallel to one another with a gap between adjacent rows.

* * * * *